(12) United States Patent
Hakomori et al.

(10) Patent No.: US 7,720,393 B2
(45) Date of Patent: May 18, 2010

(54) OPTICAL MODULE

(75) Inventors: Katsuhiko Hakomori, Kawasaki (JP);
Masakazu Horishita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/826,975

(22) Filed: Jul. 19, 2007

(65) Prior Publication Data
US 2007/0264022 A1 Nov. 15, 2007

(51) Int. Cl.
*H04B 10/06* (2006.01)

(52) U.S. Cl. .................. 398/202; 398/138; 398/130

(58) Field of Classification Search ............ 398/135, 398/136, 137, 138, 139, 140, 141, 153, 158, 398/159, 164, 171, 182, 194, 202–214, 130, 398/128
See application file for complete search history.

(56) References Cited

U.S. PATENT DOCUMENTS

| 4,941,201 | A * | 7/1990 | Davis ................. 455/41.2 |
| 6,252,163 | B1 | 6/2001 | Fujimori et al. |
| 2003/0138222 | A1* | 7/2003 | Irie ................... 385/92 |
| 2004/0047540 | A1* | 3/2004 | Moto et al. ............ 385/14 |

FOREIGN PATENT DOCUMENTS

| JP | 04-144109 | 5/1992 |
| JP | 05-284431 | 10/1993 |
| JP | 10-208818 | 8/1998 |
| JP | 10-209664 | 8/1998 |
| JP | 2002-185408 | 6/2002 |
| JP | 2002-365491 | 12/2002 |
| JP | 2003-188458 | 7/2003 |
| JP | 2004-228552 | 8/2004 |
| WO | 00/33490 | 6/2000 |

OTHER PUBLICATIONS

International Search Report of the Published Application No. PCT/JP2005/000677 (mailed Apr. 26, 2005).
PCT Published Application No. WO 2006/077639, Published Jul. 27, 2006 (International Application No. PCT/JP2005/000677).
International Preliminary Report on Patentability issued in corresponding International Patent Application No. PCT/JP2005/000677, mailed on Aug. 2, 2007.

* cited by examiner

*Primary Examiner*—M. R. Sedighian
(74) *Attorney, Agent, or Firm*—Fujitsu Patent Center

(57) ABSTRACT

In an optical module in which a transmitter and a receiver that respectively outputs and receives optical signals are stored in a casing, the transmitter and the receiver are connected to a common power line and to a common ground line, and a ferrite bead is arranged on the ground line in the receiver. The ferrite bead absorbs a high-frequency current component out of components in an electric signal passing through the ground line on which the ferrite bead is arranged. An inductance component that evolves on a ground line and a power line of a light receiving element and oscillation of a series resonance circuit that is formed of a capacitance component of the light receiving element are suppressed to reduce crosstalk.

4 Claims, 5 Drawing Sheets

| STATE | PREAMPLIFIER, PD, GND | GND ONLY | NO MEASURE |
|---|---|---|---|
| TRANSMISSION UNIT OFF [dBm] | -34.2 | | -34.4 |
| TRANSMISSION UNIT ON [dBm] | -34.0 | -33.4 | -33.0 |
| AMOUNT OF IMPROVEMENT [dB] | 0.2 | 0.8 | 1.4 |

OPTICAL MODULE

BACKGROUND OF THE INVENTION

1. Field of the Invention

The present invention relates to an optical module in which an optical signal transmitter and an optical signal receiver are integrated.

2. Description of the Related Art

The Internet traffic using the internet protocol (IP), which has spread rapidly in recent years, offers large-capacity transmission services by employing an optical fiber network for a transmission line.

Meantime, an optical transceiver for transmitting and receiving optical signals has been reduced in size as the mounting density of the device has been becoming higher and higher. Such an optical transceiver has a problem of crosstalk in which a signal passing through a transmitter leaks into a receiver adjacent to the transmitter to produce noises, etc. Some techniques have been disclosed as measures against crosstalk, which include a technique of attaching an electric wave absorber to crosstalk electric wave generation spot on a receiver and to a circuit portion showing high sensitivity on a receiver (for example, Japanese Patent Application Laid-Open Publication No. 2002-185408), and a technique of providing a transmitter with a low-pass filter (for example, International Publication Pamphlet No. 00/33490).

A ferrite bead is used as an element that is capable of suppressing crosstalk in a frequency band handled by optical communication transceivers currently available. This ferrite bead is provided in such a manner that a ferrite is formed into a small cylindrical shape, etc., and is interposed to a signal path. The ferrite bead works on such an operating principle that the ferrite absorbs a high-frequency noise component out of components contained in a passing signal, and transforms the noise component into heat to eliminate the noise component. Some techniques utilizing this principle have been disclosed. Such techniques include a technique of attaching a ferrite bead to a cable connected to a communication device (for example, Japanese Patent Application Laid-Open Publication No. H10-208818), and a technique of arranging a ferrite bead to a ground line of each device (for example, Japanese Patent Application Laid-Open Publication No. H10-209664).

The major cause of crosstalk resulting in a signal leak into an adjacent line has been thought because of a phenomenon that a high-power signal passing through a transmitter propagates through space to interfere with a signal passing through a receiver. FIG. 9 depicts an example of a countermeasure against crosstalk in a conventional optical transceiver. A transceiver 10 has a single printed substrate 11 that carries a transmitter 12 including a light-emitting diode driving circuit (LD driving circuit) driving an LD serving as a light-emitting element, and a receiver 13 including a main amplifier circuit. The transmitter 12 is connected to a light-emitting unit 14 including the LD, and the receiver 13 is connected to a light-receiving unit 15 including a PD. The light-emitting unit 14 and the light-receiving unit 15 are separated across a gap of several millimeters long. The transceiver 10 that is miniaturized in such a manner is protected from crosstalk caused by spatial signal propagation, by covering the receiver 13 with a shield 16. A shield panel or a shield case is used as the shield 16.

Being incorporated in a single unit of the miniaturized transceiver 10, the transmitter 12 and receiver 13 are supplied with power through the same power line, and are grounded through the same ground line. This produces common impedance, because of which the operation of the high-power transmitter 12 exercises an effect on the receiver 13. The effect of the common impedance has also been considered to be one of the causes of crosstalk. Thus, separating the transmitter 12 from the receiver 13 by providing the shield 16 shown in FIG. 9 has been considered to be effective in reducing crosstalk caused by the common impedance.

In these days, however, such common specifications as small form-factor pluggable (SFP), small form factor (SFF), and 10-gigabit small form factor pluggable (XFP) have been established as standardized optical modules for use in optical transceivers operated in the Internet traffic using an optical fiber network. Hence the functions and forms of optical transceivers have been more and more integrated.

As a result, providing an optical module with the shield 16 is difficult when the optical module is under a size restriction. If a shield panel or a shield case is assembled into the shield 16, and if the receiver 13 is housed in the shield 16, the overall size of the optical module cannot be reduced into a compact size.

SUMMARY OF THE INVENTION

It is an object of the present invention to at least solve the above problems in the conventional technologies.

An optical module according to one aspect of the present invention includes a transmitter and a receiver that respectively outputs and receives optical signals stored in a casing. The transmitter and the receiver are connected to a common power line and to a common ground line, and a ferrite bead is arranged on the ground line in the receiver.

An optical module according to another aspect of the present invention includes a transmitter and a receiver that respectively outputs and receives optical signals stored in a casing. The transmitter and the receiver are connected to a common power line and to a common ground line. The receiver includes a light-receiving unit having a light-receiving element and a preamplifier, the light-receiving element receiving an input optical signal and converting the optical signal into an electric signal, the preamplifier amplifying the electric signal output from the light-receiving element; and a main amplifier circuit mounted on a printed board that is connected to the light-receiving unit, and amplifying the electric signal output from the light-receiving unit. A ferrite bead is arranged on a power line of the light-receiving element, and on a power line and a ground line of the preamplifier.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Exemplary embodiments according to the present invention will be explained in detail with reference to the accompanying drawings.

Figure 1:
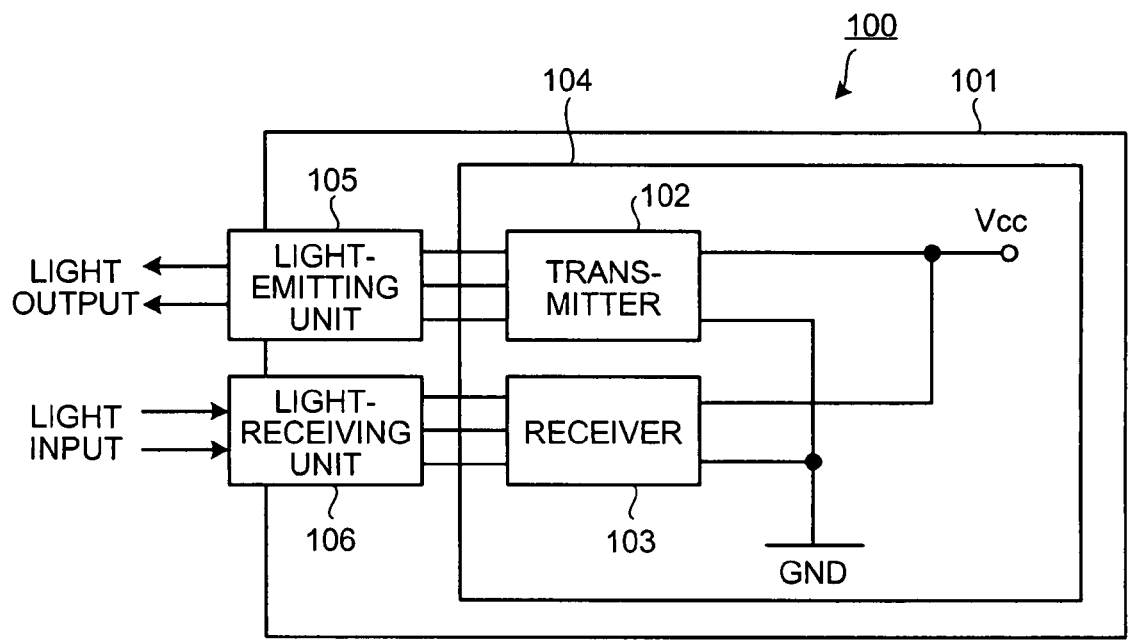
FIG. 1 depicts a configuration of an optical module according to a first embodiment of the present invention.

FIG. 1 depicts a configuration of an optical module according to a first embodiment of the present invention. An optical module 100 includes a printed substrate 104 having a transmitter 102 and a receiver 103 stored in a standardized casing 101, a light-emitting unit 105 that is connected to the transmitter 102 and that outputs light to a transmission line (not shown), and a light-receiving unit 106 that is connected to the receiver 103 and that receives input light from a transmission line (not shown). Both the transmitter 102 and the receiver 103 on the printed substrate 104 are provided with power from a common power supply (Vcc), and are connected to a common ground (GND).

Figure 2:
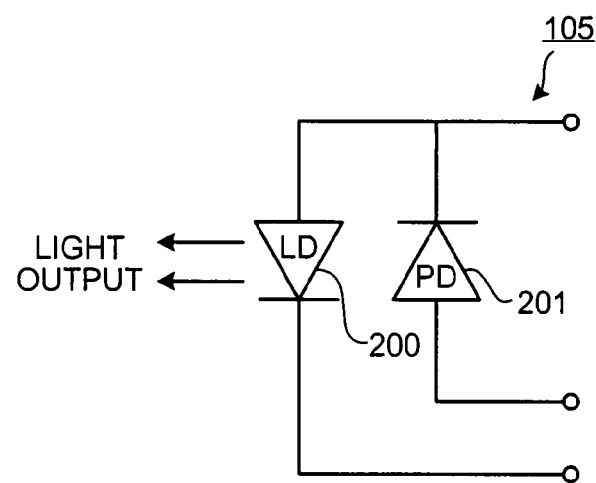
FIG. 2 depicts a circuit configuration of a light-emitting unit.

FIG. 2 depicts a circuit configuration of the light-emitting unit. The light-emitting unit 105 is composed of a laser diode (LD) 200 that is a light-emitting element that outputs light (optical signal) to the optical fiber transmission line connected to the light-emitting unit 105, and a photo diode (PD) 201 is a light-receiving element to monitor an output from the LD 200. When an optical signal is transmitted out of the optical module 100 (see FIG. 1), an LD driving circuit in the transmitter 102 is turned on and off repeatedly to generate a binary electric signal to be input to the light-emitting unit 105. The LD 200 of the light-emitting unit 105 then converts the input electric signal into an optical signal synchronized with the electric signal, and outputs the optical signal to the transmission line. At this time, the PD 201 outputs an electric signal corresponding to the reception intensity of output light from the LD 200, sending the electric signal to the transmitter 102. In this manner, the PD 201 monitors output signals from the LD 200 to enable stable light output.

Figure 3:
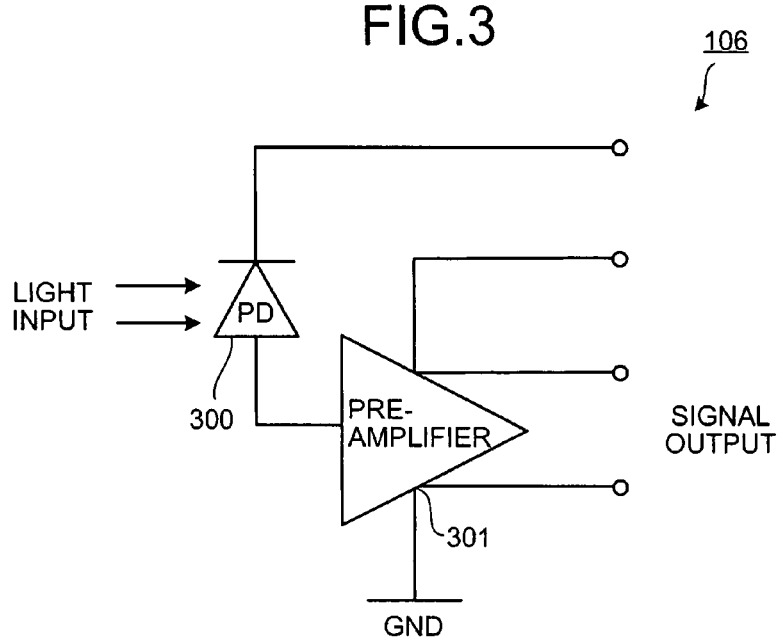
FIG. 3 depicts a circuit configuration of a light-receiving unit.

FIG. 3 depicts a circuit configuration of the light-receiving unit. The light-receiving unit 106 is composed of a light-receiving element (PD) 300 that converts input light (optical signal) from the optical fiber transmission line connected to the light-receiving unit 106 into an electric signal, and a preamplifier 301 that amplifies an electric signal from the PD 300. The receiver 103 (see FIG. 1) connected to the light-receiving unit 106 serves as a main amplifier circuit, receiving electric signals. Both the transmitter 102 and the receiver 103 are mounted on the same printed substrate 104 (see FIG. 1), and are provided with power from the same power supply (Vcc) and connected to the same ground (GND), as described above.

When the above optical module 100 is fabricated according to such a specification as SFP, a clearance between the light-emitting unit 105 and the light-receiving unit 106 is only a few millimeters. In this state, high-power currents driving the LD 200 flow constantly through the light-emitting unit 105, where the output power of the currents is about several thousands times that of currents converted from light received by the PD 300 of the light-receiving unit 106. This brings a concern about an effect of spatial signal propagation that is considered to be the major cause of crosstalk, as described above.

A study by the inventor, etc., of crosstalk occurring in the optical module 100 of the present invention has revealed that the major cause of the crosstalk is the common impedance that occurs when both transmitter 102 and receiver 103 are connected to the same power supply (Vcc) and the same ground (GND).

Figure 4:
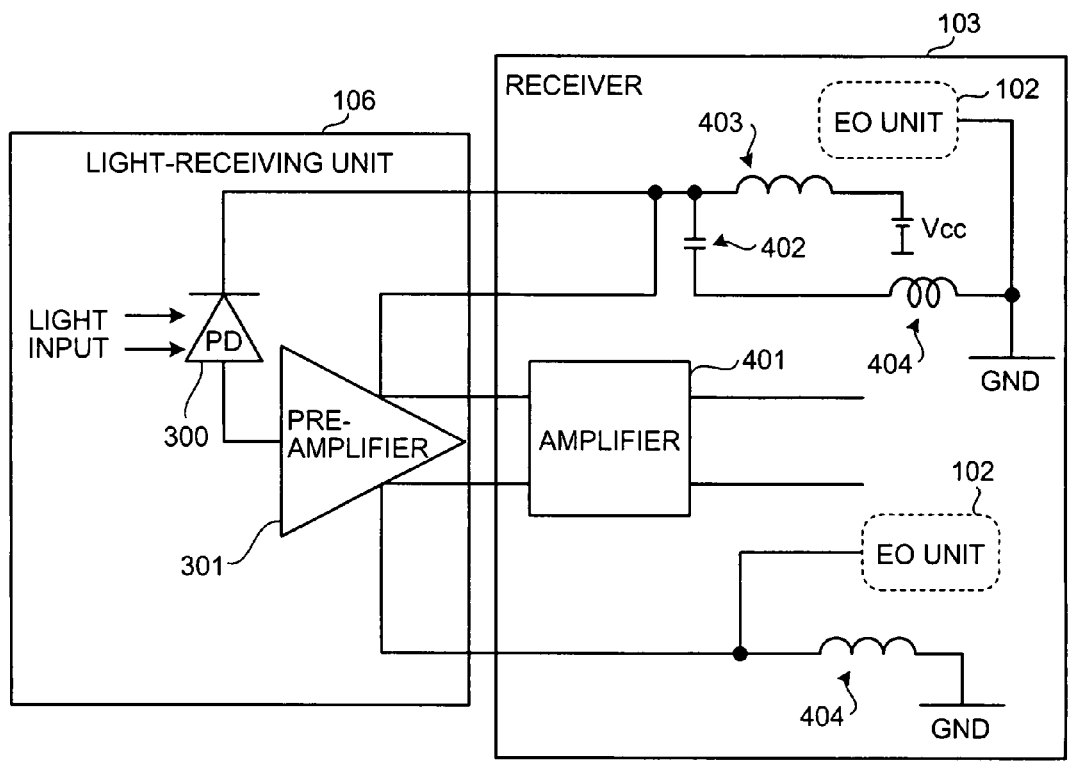
FIG. 4 is a model view of a circuit configuration of the optical module without a countermeasure against crosstalk.

FIG. 4 depicts a circuit configuration of the optical module before a countermeasure against crosstalk is taken for the optical module. A principle of the generation of crosstalk by common impedance will be described referring to FIG. 4. FIG. 4 exhibits the circuit configuration mainly composed of the receiver 103 and light-receiving unit 106 of the optical module 100 (see FIG. 1).

The preamplifier 301 shown in FIG. 4 is connected to a power supply (Vcc) line and to a ground (GND) line. The output terminals of the preamplifier 301 are connected to an amplifier 401 that further amplifies an output signal from the preamplifier 301. The amplifier 401 is also connected to the power supply (Vcc) line and the ground (GND) line, however, the description of the connection is omitted here. A capacitor 402 is a bypass capacitor having a function of reducing the impedance of the power supply (Vcc) line to prevent the addition of noises to an electric signal traveling through the circuit.

An electro-optic (EO) unit is the transmitter 102. The power supply (Vcc) and a plurality of grounds (GND) shown in FIG. 4 are the same power supply (Vcc) and the ground (GND) that are connected to the receiver 103 and to the transmitter (EO unit) 102. Although a plurality of transmitters (EO units) 102 are shown in FIG. 4, it actually means that a single transmitter (EO unit) 102 is connected to the ground (GND).

In the electric circuit as shown in FIG. 4, an inductance component evolves on the power supply (Vcc) line through which power is supplied. A coil 403 shown in FIG. 4 does not represent an actually incorporated circuit element, such as coil, but represents an equivalent inductance. Likewise, a coil 404 represents an equivalent inductance evolving on the ground (GND) line. These equivalent inductance components cannot be eliminated by merely providing the capacitor 402 operating as the bypass capacitor.

As described above, the transmitter 102 and the receiver 103 form the common impedance as both units handle currents different in output power. Because of this, the inductance component that evolves on the ground (GND) line due to the effect of high-power currents flowing through the transmitter 102 generates a voltage that becomes the source of crosstalk. As a result, a current leaks into the PD 300 to cause such a trouble that light reception sensitivity at the receiver 103 deteriorates, and that a light reception alarming function operates improperly as if it responded to the reception of an optical signal despite of no reception of the signal.

The PD 300 is regarded as a capacitor (capacitance) when viewed as an element in an alternating current circuit. Thus, a series resonance circuit formed of the total inductance component of the coil 403 and coil 404 and the capacitance component of the PD 300 resonates, and a high-power through-current flows through the circuit as crosstalk. Using the capacitor 402 as the above bypass capacitor, therefore, offers no expected effect of reduction in crosstalk. A study has lead to a conclusion that the most effective method as a countermeasure against crosstalk is to cut off the high-frequency components of crosstalk current flowing through the series resonance circuit to prevent the resonance of the circuit.

Figures 5, 6:
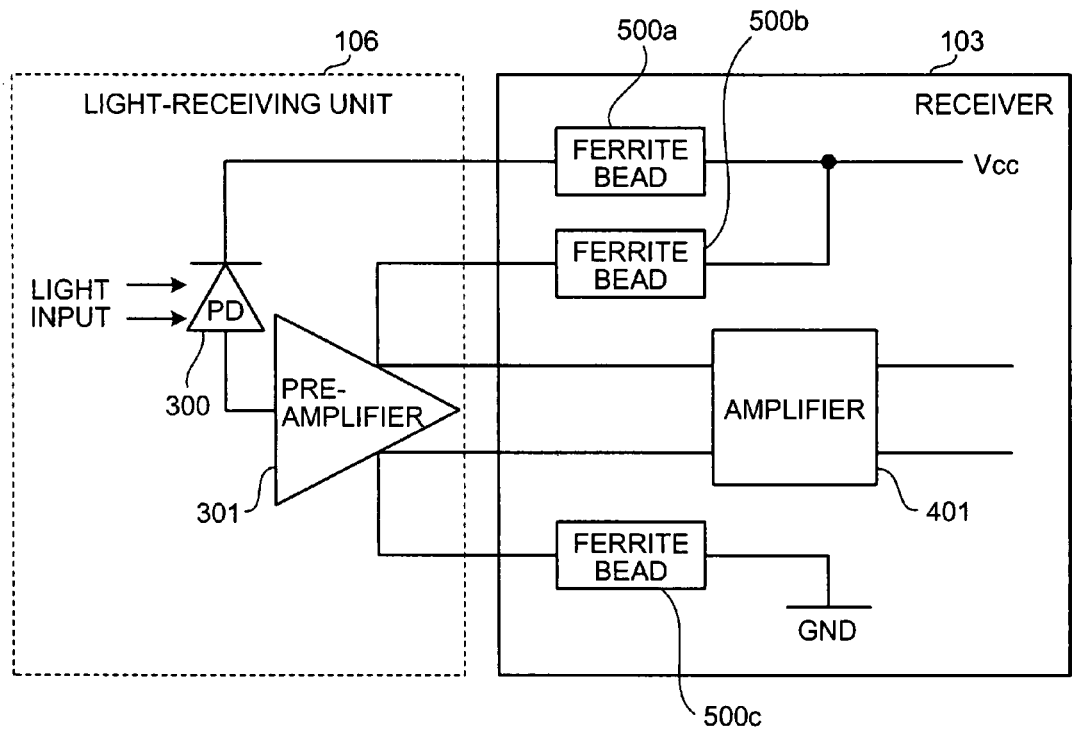
FIG. 5 depicts a circuit configuration of the optical module with a countermeasure against crosstalk measure.
FIG. 6 is a table showing effects against crosstalk by arrangement of ferrite beads.

FIG. 5 depicts a circuit configuration of an optical module for which a countermeasure against crosstalk is taken. According to the present embodiment, to prevent crosstalk, an element cutting off high-frequency on the circuit carrying the element is used for the optical module 100. This element for cutting off high-frequency can be provided as a general-purpose ferrite bead. Specifically, three ferrite beads are disposed separately at three spots, as shown in FIG. 5, where a ferrite bead 500a is arranged to the power supply (Vcc) line of the PD 300, a ferrite bead 500b is arranged to the power supply (Vcc) line of the preamplifier 301, and a ferrite bead 500c is arranged to the ground (GND) line other than the lines where a signal received by the PD 300 travels through.

The ferrite bead 500 (500a to 500c) arranged to the optical module 100 (arranged in the same manner on an optical module 700 to be described later) according to the present invention has a structure in which current-passing inner electrodes are embedded in a ferrite element. The ferrite element works as a magnetic material, functioning to absorb high-frequency current components contained in an electric signal passing through the wiring of the line to which the ferrite bead 500 (500a to 500c) is arranged and transform the high-frequency current components into joule heat. In other words, the ferrite element has the characteristics that has low resistance to a direct current flowing through the wiring while has high resistance to an alternating current flowing through the wiring. In comparison with another element having a similar function, such as coil, the ferrite bead has an advantage over another element of damping only the high-frequency, being capable of substantially reducing high-frequency radiation to the surroundings. The ferrite bead thus has a characteristic of being capable of improving a negative effect of crosstalk caused by spatial signal propagation.

Generally, the sharpness of oscillation in a resonance circuit is expressed by a physical quantity Q (Quality factor). In the case of the above series resonance circuit, the sharpness of oscillation is acquired by the equation below. In the equation, $f_0$ is a resonance frequency, $\Delta f$ is a bandwidth around the resonance frequency, L is the inductance of a coil (equivalent inductances represented by the coils 403, 404 in the case of the optical module 100), C is a capacitance (the junction capacitance of the PD 300), and R is the electric resistance of a resonance circuit.

$$Q = f_0/\Delta f = 2\pi f_0 L/R = 1(2\pi f_0 CR) = (L/C)^{1/2}/R \quad (1)$$

The larger the value of Q is, the larger the amount of current flowing at the oscillation of the series resonance circuit is. To minimize the value of Q, therefore, the electric resistance and the capacitance should be increased and the inductance should be reduced, which is obvious from Equation 1. The ferrite beads 500a to 500c increase the resistance of the high-frequency components to reduce the value of Q. Reducing the value of Q makes it difficult for a current caused by crosstalk from the transmitter 102 to flow into the PD 300.

Crosstalk is inhibited in the above manner according to the present invention. In particular, the ferrite beads 500a to 500c have the maximum resistance in the frequency band of several tens of megahertz (MHz) to 1 gigahertz (GHz). This makes the ferrite beads 500a to 500c extremely effective against crosstalk occurring in the frequency band of 1 GHz bit/sec or lower. For example, the ferrite beads are used against high-frequency components in the frequency bands of 155 MHz, 622 MHz, and 1.25 GHz to reduce crosstalk.

FIG. 6 is a table showing effects against crosstalk by ferrite beads. In FIG. 6, the reception sensitivity of the receiver 103 is expressed numerically (dBm) for a case where the transmitter 102 does not transmit light (turned off), and for a case where the transmitter 102 transmits light (turned on). The table in FIG. 6 also exhibits an amount of improvement (dB) resulting from each countermeasure. The table indicates that the light reception sensitivity is higher as the values in the table get smaller, and that the improvement is greater as the value of amount of improvement becomes smaller.

The table shown in FIG. 6 presents measurements obtained from the following circuit configurations. 1. The ferrite beads 500 (500a to 500c) are arranged for the preamplifier 301, the PD 300, and on the GND (line). 2. The ferrite bead 500 (500c) is arranged on the GND (line) only. 3. No ferrite bead 500 is provided not taking any countermeasure against crosstalk.

Since no crosstalk occurs when the transmitter 102 transmits no light, an amount of improvement resulting from each countermeasure is examined on the basis of a reference state where the transmitter 102 is turned off and no countermeasure is taken (−34.4 dBm). A measurement of the light reception sensitivity is −33.0 dBm when the transmitter 102 is turned on with no countermeasure being taken. This gives an amount of improvement of 1.4 dB that indicates the deterioration of the light reception sensitivity.

When the ferrite beads 500 (500a to 500c) are arranged to the preamplifier 301, the PD 300, and the GND (line), or the ferrite bead 500 (500c) is arranged to the GND (line) only while the transmitter 102 is tuned off, a measurement of the light reception sensitivity becomes −34.2 dBm that indicate improvement in the light reception sensitivity from that in the reference state where no countermeasure is taken. If the transmitter 102 is turned on in this state, a light reception sensitivity of −33.4 dBm and an amount of improvement of 0.8 dBm result when the ferrite bead 500 (500c) is arranged to the GND (line) only. This indicates that deterioration of the sensitivity is less than the case of no countermeasure. Likewise, a light reception sensitivity of −34.0 dBm and an amount of improvement of 0.2 dBm result when the ferrite beads 500 (500a to 500c) are arranged to the preamplifier 301, the PD 300, and the GND (line). This indicates that the deterioration of the sensitivity is suppressed to a minor level compared to the case of no countermeasure.

As described above, according to the first embodiment of the present invention, the ferrite bead is arranged to the circuit composing the receiver 103. This prevents the oscillation of the equivalent series resonance circuit that is formed of the common impedance and the equivalent inductance of the transmitter 102 and receiver 103, thus prevents crosstalk between the transmitter 102 and the receiver 103.

Figure 7:
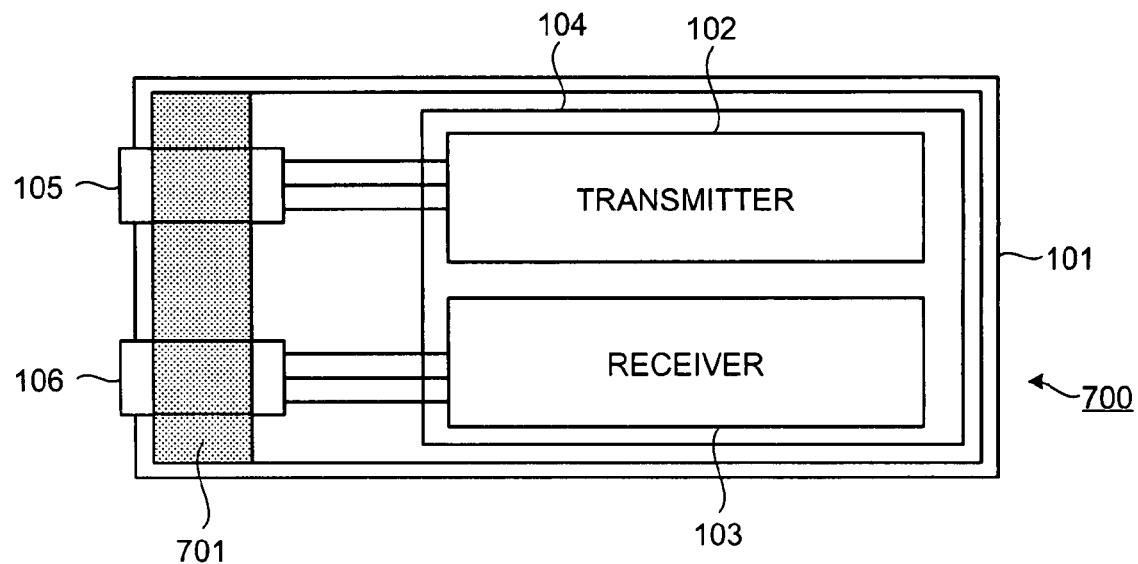
FIG. 7 depicts a configuration of an optical module according to a second embodiment of the present invention.
Figure 8:
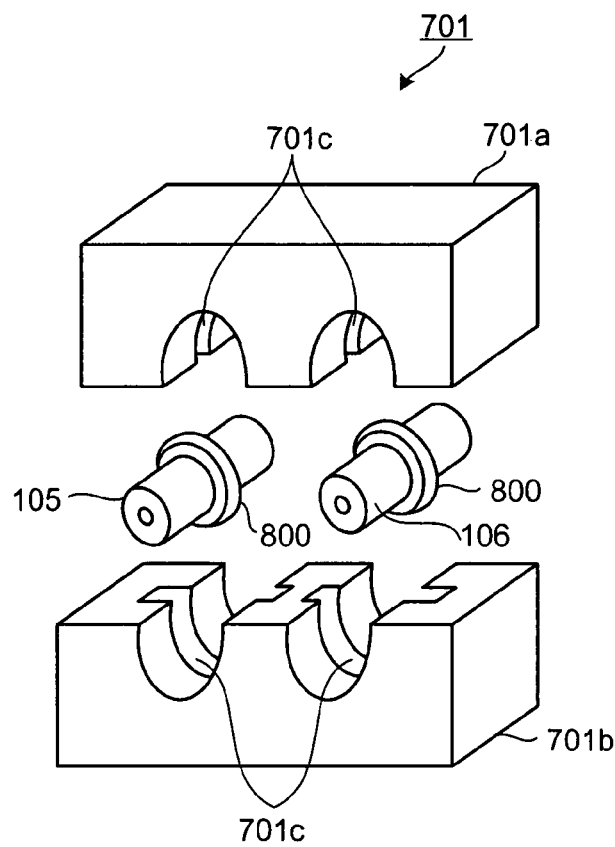
FIG. 8 is a perspective view for illustrating a configuration of a support in the optical module according to the second embodiment.
Figure 9:
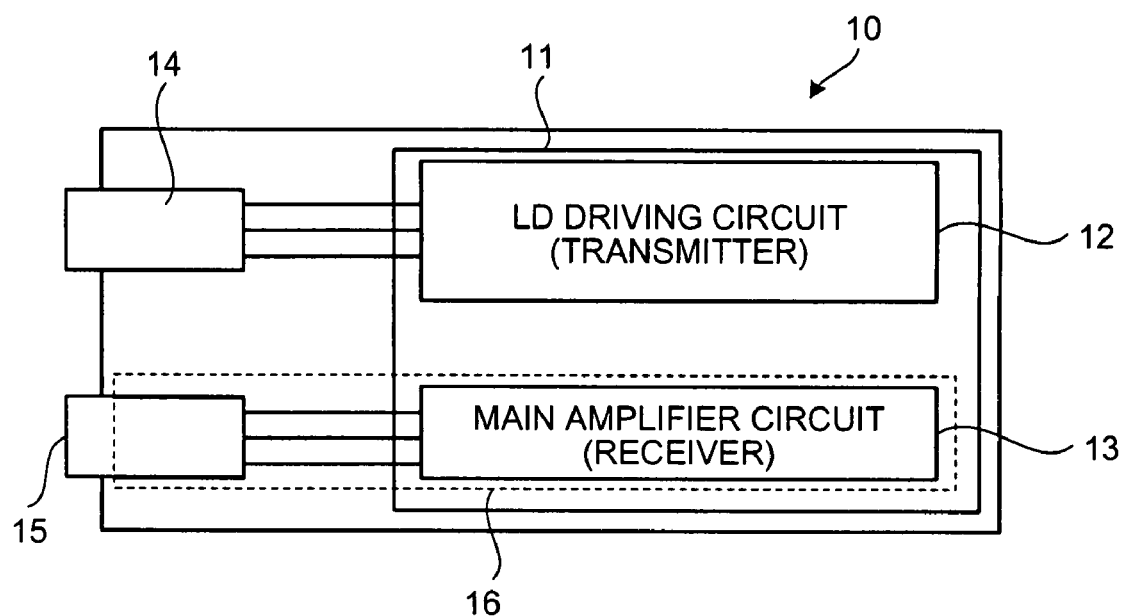
FIG. 9 depicts an example of a countermeasure against crosstalk in a conventional optical transceiver.

FIG. 7 depicts a configuration of an optical module according to a second embodiment of the present invention. FIG. 8 is a perspective view for illustrating a configuration of a support in the optical module according to the second embodiment.

Similarly to the optical module 100 of the first embodiment, the optical module 700 includes the printed substrate 104 having the transmitter 102 and the receiver 103 stored in the casing 101 conforming to such a standard as SFP, the transmitter 102 mounted on the printed substrate 104, the light-emitting unit 105 connected to the transmitter 102, the receiver 103 mounted on the printed substrate 104, and the light-receiving unit 106 connected to the receiver 103. Both transmitter 102 and receiver 103 on the printed substrate 104 are provided with power from the common power supply (Vcc), and are connected to the common ground (GND). The optical module 700 is further provided with a support 701 to mount the light-emitting unit 105 and light-receiving unit 106 on the casing 101.

The support 701 fixes the light-emitting unit 105 and light-receiving unit 106 to the casing 101 in such a manner that flanges 800 projecting from the outer peripheries of the light-emitting unit 105 and light-receiving unit 106 of the optical module 700 are held between slots 701c formed on an upper support 701*a* and slots 701*c* formed on a lower support 701*b*. The support 701 is made of an insulator, or of a metal or ferrite material subjected to an insulation process, having a function of an electric wave absorber. This support 701 absorbs a voltage component causing crosstalk to further reduce crosstalk. The support 701 is particularly effective to a small-size optical module that transmits light having a wavelength in the frequency band of 1 GHzbit/sec or lower.

The support 701 explained in the second embodiment can be employed in combination with the ferrite beads 500 (500*a* to 500*c*) explained in the first embodiment.

According to the embodiments descried above, an optical module can be miniaturized in overall size, and crosstalk can be reduced with a simple configuration without providing a shield.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An optical module in which a transmitter and a receiver that respectively outputs and receives optical signals are stored in a casing, wherein
    the transmitter and the receiver are connected to a common power line and to a common ground line,
    the receiver includes
        a light-receiving unit having a light-receiving element and a preamplifier, the light-receiving element receiving an input optical signal and converting the optical signal into an electric signal, the preamplifier amplifying the electric signal output from the light-receiving element; and
        a main amplifier circuit mounted on a printed board that is connected to the light-receiving unit, and amplifying the electric signal output from the light-receiving unit, and
    a ferrite bead is arranged on each of a power line of the light-receiving element, and a power line and a ground line of the preamplifier.

2. The optical module according to claim 1, wherein
    the transmitter is includes a light-emitting unit having a light-emitting element that converts an electric signal into an optical signal to output the optical signal, and a light-emitting element driving circuit that drives the light-emitting element, and
    the main amplifier circuit of the receiver and the light-emitting element driving circuit of the transmitter are arranged on a single printed board.

3. The optical module according to claim 1 comprising a support made of an insulation material to mount the light-emitting unit and the light-receiving unit on the casing.

4. The optical module according to claim 3, wherein the support is made of a ferrite material.

* * * * *

UNITED STATES PATENT AND TRADEMARK OFFICE
CERTIFICATE OF CORRECTION

| | | |
|---|---|---|
| PATENT NO. | : 7,720,393 B2 | |
| APPLICATION NO. | : 11/826975 | |
| DATED | : May 18, 2010 | |
| INVENTOR(S) | : Hakomori et al. | |

It is certified that error appears in the above-identified patent and that said Letters Patent is hereby corrected as shown below:

On the Title Page, the Related U.S. Application Data should be added below the Prior Publication Data and above the International Classification as shown below:

Item (65)      Prior Publication Data
US 2007/0264022 A1    Nov. 15, 2007
should read, -- Item (63)      Related U.S. Application Data
Continuation of application No. PCT/JP2005/000677, filed on Jan. 20, 2005 --

Item (51)      Int. Cl.

Signed and Sealed this
Thirty-first Day of May, 2011

David J. Kappos
*Director of the United States Patent and Trademark Office*